United States Patent [19]

Cox et al.

[11] Patent Number: 4,462,004
[45] Date of Patent: Jul. 24, 1984

[54] DYNAMIC CLASS-4 FET AMPLIFIER

[75] Inventors: Donald C. Cox, Tinton Falls; Adel A. M. Saleh, Holmdel, both of N.J.

[73] Assignee: AT&T Bell Laboratories, Murray Hill, N.J.

[21] Appl. No.: 359,220

[22] Filed: Mar. 18, 1982

[51] Int. Cl.³ .......................... H03F 3/16; H03G 3/10
[52] U.S. Cl. .................................. 330/277; 330/296; 330/281
[58] Field of Search .............. 330/277, 279, 281, 285, 330/278, 296

[56] References Cited

U.S. PATENT DOCUMENTS

| | | | |
|---|---|---|---|
| 3,961,280 | 6/1976 | Sampei | 330/267 |
| 3,984,783 | 10/1976 | Bickley | 330/296 |
| 4,054,843 | 10/1977 | Hamada | 330/263 |
| 4,077,013 | 2/1978 | Morez et al. | 330/267 |
| 4,115,739 | 2/1978 | Sano et al. | 330/263 |
| 4,220,929 | 9/1980 | Talbot et al. | 330/279 |

*Primary Examiner*—James B. Mullins
*Assistant Examiner*—G. Wan
*Attorney, Agent, or Firm*—Wendy W. Koba

[57] ABSTRACT

The present invention relates to a linear, class A FET amplifier circuit capable of providing linear amplifier of input signals with a time-varying envelope function. An envelope detector (12) is responsive to an input signal ($v_i(t)$) for extracting the envelope signal ($V_i(t)$) therefrom. A gate controller (16) subsequently adds the envelope signal to a predetermined gate bias voltage ($E_G$) and applies the sum ($E_G(t)$) as the "d-c" gate input to the FET amplifier (14). Therefore, the gate bias voltage is dynamically controlled by the envelope of the input signal, resulting in a significant improvement in the power-added efficiency ($\eta_{added}$) over prior art class A FET amplifiers.

4 Claims, 3 Drawing Figures

DYNAMIC CLASS-A FET AMPLIFIER

BACKGROUND OF THE INVENTION

1. Field of the Invention

The present invention relates to a dynamic, class-A FET amplifier, and more particularly, to a class-A FET amplifier which includes a signal envelope detector which is used for dynamically controlling the gate supply voltage in accordance with the envelope of the input signal.

2. Description of the Prior Art

There has been an on-going effort to increase the linearity, dynamic range, stability, and power conversion efficiency of power amplifiers. As more of these devices are used at higher frequencies, notably microwave frequencies, there is a need to improve the efficiency of these devices.

One amplifier circuit with an improved degree of efficiency is disclosed in U.S. Pat. No. 3,961,280 issued to T. Sampei on June 1, 1976. The Sampei circuit comprises a plurality of separate power sources for generating different voltages, and means for changing, in steps, the power supply voltages applied to the collector (or drain) input of a transistor amplifying element as a function of the instantaneous amplitude of the input signal. The change in collector power supply thereby allows the amplifying element to provide approximately the maximum output signal for a varying amplitude input signal. Such an arrangement, however, becomes large and cumbersome to operate at higher frequencies, and following the instantaneous amplitude of a microwave frequency input signal is extremely difficult.

An alternative arrangement is disclosed in U.S. Pat. No. 3,984,783 issued to R. H. Bickley on Oct. 5, 1976, which relates to an amplifying circuit capable of providing the gain and linearity of a class A amplifier, while also providing the power conversion efficiency of a class B or C amplifier. As disclosed, the Bickley device includes a biasing network and switch, where the switch is responsive to the amplitude of the input signal and functions to alter the bias network so as to allow the amplifier to function alternatively in class A, B, or C mode, depending on the amplitude of the input signal. However, as with the previously described arrangement, the Bickley arrangement becomes impractical at microwave frequencies, where the amplitude of the input signal changes quickly as a function of time.

A problem remaining in the prior art, therefore, is to provide an arrangement for increasing the power conversion efficiency of power amplifiers which operate at microwave frequencies.

SUMMARY OF THE INVENTION

The problem remaining in the prior art has been solved in accordance with the present invention, which relates to a dynamic class-A FET amplifier, and more particularly, to a class-A FET amplifier which includes a signal envelope detector which is used for dynamically controlling the gate supply voltage in association with the envelope of the input signal.

It is an aspect of the present invention to provide increased power efficiency at microwave frequencies by controlling the gate supply voltage with the envelope of the input signal, instead of the instantaneous amplitude of the input signal as was done in the prior art.

Other and further aspects of the present invention will become apparent during the course of the following description, and by reference to the accompanying drawings.

BRIEF DESCRIPTION OF THE DRAWING

Referring now to the drawings in which like numerals represent like parts in several views.

DETAILED DESCRIPTION

The modulation and multiplexing schemes used in many communication systems result in signals having highly time-varying envelopes. This is the case, for example, in frequency-division-multiplex systems employing either multiple carriers or single-sideband (SSB) signals, and in bandwidth-efficient digital systems employing quadrature amplitude modulation (QAM). A power amplifier employed in any of these systems is required to operate with a reasonable degree of linearity. This is accomplished by backing-off the average output power of the amplifier away from saturation so as to restrict the range of signal envelope variations to the essentially linear region of amplification. In class-A field-effect-transistor (FET) power amplifiers, the d-c bias power is basically independent of the signal level. Thus, the amplifier efficiency is reduced from its peak (saturation) value by the amount of backoff. Such a reduction in efficiency results in a severe power penalty which could be unacceptable, especially on a satellite where the d-c power is costly and of limited supply.

Figure 1:
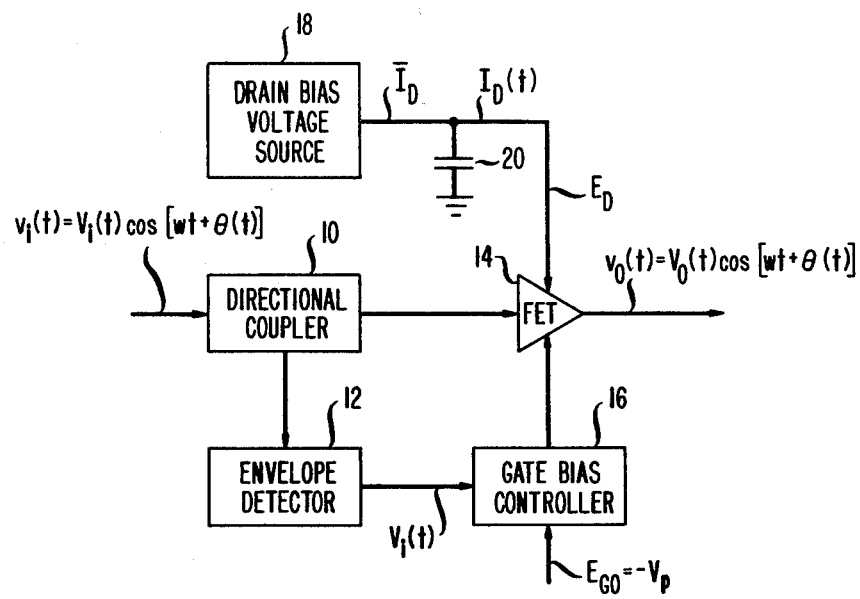
FIG. 1 illustrates a dynamic class-A FET amplifier circuit, denoted class-$\tilde{\text{A}}$, formed in accordance with the present invention.

The present invention provides an arrangement for improving the efficiency of class-A FET power amplifiers operating with varying-envelope signals. The arrangement, denoted as class-$\tilde{\text{A}}$, is illustrated in FIG. 1. In prior art class A amplifier arrangements, an input signal $v_i(t)$ would be directly applied as a source input to an FET amplifier 14, where in accordance with the attributes of the FET device, an amplified version thereof, denoted $v_o(t)$ would appear at the output of FET amplifier 14. The d-c bias power is determined by both a drain bias voltage $E_D$ and a gate bias voltage $E_G$, which are supplied by a drain bias voltage source 18 and a gate bias voltage source 16, respectively.

In accordance with the present invention, instead of applying input signal $v_i(t)$ directly to FET amplifier 14, input signal $v_i(t)$ is applied as an input to a directional coupler 10 which functions to divide the signal into two components; one component of relatively large magnitude and one component of relatively small magnitude. The smaller component, which may comprise, for example, the input signal power reduced by 10 to 20 dB, is subsequently applied as an input to an envelope detector 12. Envelope detector 12 functions to extract the envelope signal from input signal $v_i(t)$. One exemplary arrangement of envelope detector 12 includes a diode followed by a parallel resistor and capacitor arrangement, where the parallel RC combination must be chosen so as to allow envelope detector 12 to follow the envelope of a microwave input signal. In particular, since input signal $v_i(t)$ may be defined as $$v_i(t) = V_i(t) \cos[\omega t + \theta(t)], \quad (1)$$

where $V_i(t)$ is the time-varying input envelope and $[\omega t + \theta(t)]$ is the time-varying input phase, envelope detector 12 will filter out the phase information of input signal $v_i(t)$ and produce as an output, as shown in FIG. 1, input envelope signal $V_i(t)$. The larger component of input signal $v_i(t)$ which is produced as an output of directional coupler 10 is subsequently applied as an input to FET amplifier 14, as described hereinbefore in relation to prior art arrangements.

Input envelope signal $V_i(t)$ from envelope detector 12 is subsequently applied as an input to gate bias voltage source 16, which functions to add envelope signal $V_i(t)$ to a d-c gate bias voltage $E_{Go}$ and produce as an output a gate bias control signal $E_G(t)$, where $E_G(t) = E_{Go} + V_i(t)$. The gate bias voltage $E_G(t)$ will be defined in greater detail in the discussion related to FIG. 2.

As mentioned hereinbefore, drain bias voltage source 18 supplies the necessary voltage to the drain input of FET amplifier 14 to allow FET amplifier 14 to operate in a class-A mode, that is, to allow the output current to flow for the full cycle of the input current. In accordance, however, with the operation of FET amplifier 14 in the class-$\tilde{A}$ mode of the present invention, the time-dependence of gate bias control voltage $E_G(t)$ will cause the drain current $I_D(t)$ from source 16 to also fluctuate in a manner proportional to the input signal envelope $V_i(t)$. Therefore, in accordance with the present invention, a capacitor 20 is included in the drain bias circuit to absorb the fluctuating component of the drain current while maintaining an almost constant drain bias voltage $E_D$.

As shown in FIG. 1, FET amplifier 14 subsequently produces as an output a time-varying signal $v_o(t) = V_o(t) \cos[\omega t + \theta(t)]$, where $V_o(t)$ is defined as the time-varying output envelope and $[\omega t + \theta(t)]$ is defined as the time-varying output phase. In accordance with the above-defined class-$\tilde{A}$ operation of FET amplifier 14, output signal $v_o(t)$ exists over the full cycle of input signal $v_i(t)$.

Figure 2:
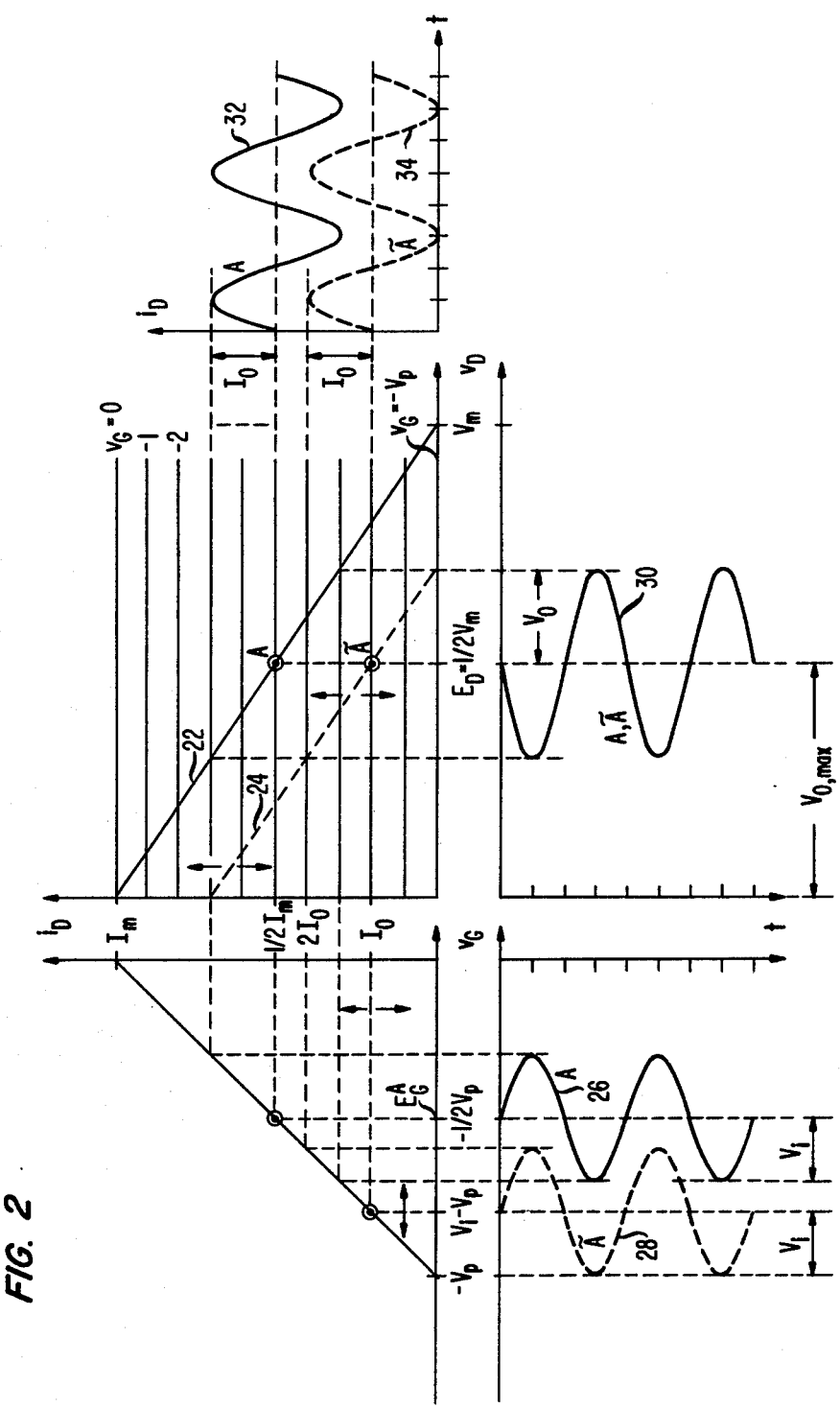
FIG. 2 illustrates an idealized FET model showing the load lines, and the voltage and current waveforms for operation in both prior art class-A mode (solid lines), and class-$\tilde{\text{A}}$ mode of the present invention (dashed lines)

The gate-voltage $v_G$, drain-current $i_D$ and drain-voltage $v_o$ characteristics for an idealized FET model operated in both the conventional class-A mode and the class-$\tilde{A}$ mode of the present invention are illustrated in FIG. 2. For the purposes of illustration, the characteristics are shown for a particular instant of time where input envelope signal $V_i(t) = V_i$, since the illustrations of the characteristics as a function of time would unnecessarily complicate the figure. In association with the illustration in FIG. 2, $V_p$ is defined as the gate pinch-off voltage, $V_m$ is the maximum allowable drain voltage, and $I_m$ is the maximum drain current, which is obtained at zero gate voltage. The gate d-c bias voltage $E_G(t)$, mentioned hereinbefore, which is required to operate the FET in either class A or class $\tilde{A}$ mode is defined, respectively, by $$E_G^A(t) = -V_p/2 = \text{a constant}, \quad (2)$$

$$E_G^{\tilde{A}}(t) = -V_p + V_i(t), \quad (3)$$

where $V_i(t)$ is the above-described input signal voltage envelope, and where it is noted that $E_{Go}$ is equal to $-V_p$. The drain bias voltage $E_D$, and the r-f load resistance $R_L$ are identical for both classes, and defined by $$E_D = V_m/2, \text{ and} \quad (4)$$

$$R_L = V_m/I_m. \quad (5)$$

A pair of load lines 22 and 24 input voltage waveforms 26 and 28, and output voltage and current waveforms 30, 32 and 34 for both class A and class $\tilde{A}$ are shown in FIG. 2, where class A waveforms are illustrated with solid lines and class $\tilde{A}$ waveforms are illustrated with dashed lines, respectively. The slope, m, of each load line 22 and 24 is equal to $-1/R_L$. In accordance with the present invention, load line 24 for class $\tilde{A}$ moves up and down parallel to itself, as indicated by the arrows shown in FIG. 2, in response to variations in gate bias control voltage $E_G(t)$ associated with input envelope signal $V_i(t)$. Load line 22 for the prior art class A mode remains fixed. Thus, the operating point on the load line of the present invention's class $\tilde{A}$ mode of operation is responsive to changes in the envelope of the input signal $v_i(t)$, while the operating point of conventional class A is not responsive at all.

The r-f output power $P_o(t)$ of an FET amplifier, which is time-dependent because of signal envelope variations, is defined by $$P_o(t) = V_o(t)I_o(t)/2, \quad (6)$$

where $I_o(t) = V_o(t)/R_L$ is the fundamental-frequency component of the drain current. The normalized output-envelope is defined as $$r(t) = V_o(t)/V_{o,max}. \quad (7)$$

Noting from FIG. 2 that $V_{o,max} = V_m/2$, and employing equations (6) and (7), r-f output power $P_o(t)$ may be defined as $$P_o(t) = r^2(t) V_m I_m/8. \quad (8)$$

The d-c drain power $P_D(t)$, which is also time-dependent, is defined by $$P_D(t) = E_D I_D(t) \quad (9)$$

The power-added efficiency $\eta_{added}$, the parameter of interest in association with the present invention, is defined by $$\eta_{added} = (\bar{P}_o - \bar{P}_i)/\bar{P}_D, \quad (10)$$

where $\bar{P}_i$ is the average power of input signal $v_i(t)$. A power gain G is defined by $$G = \bar{P}_o/\bar{P}_i. \quad (11)$$

It can be determined, by reference to FIG. 2, that for the same output power $P_o(t)$, both class A and class $\tilde{A}$ utilize the same input envelope $V_i$. Thus, the power gain of these classes are identical, that is, $$G_{\tilde{A}} = G_A. \quad (12)$$

Figure 3:
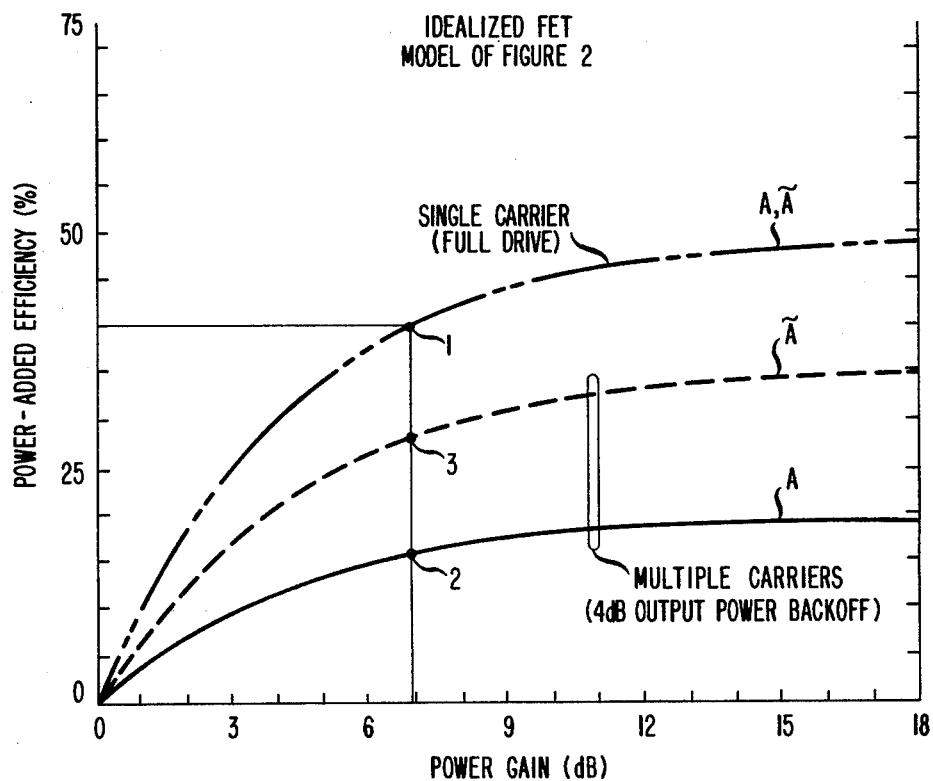
FIG. 3 illustrates a comparison of the power-added efficiency of a class-$\tilde{\text{A}}$ FET amplifier formed in accordance with the present invention in relation to a prior art class-A FET amplifier.

Power-added efficiencies $\eta^A_{added}$ and $\eta^{\tilde{A}}_{added}$ are plotted in FIG. 3 as a function of power gain $G_A$ and $G_{\tilde{A}}$, respectively, for both a single carrier input signal and a multiple carrier input signal. It is to be noted that the power gain, $G_A$ or $G_{\bar{A}}$, is dependent on the particular FET being used. For a single carrier input signal, the envelope signal associated therewith is equal to a constant $V_i$, that is $$v_i(t) = V_i \cos[\omega t + \theta(t)]. \quad (13)$$

Under full drive, $V_i$ is equal to $V_p/2$. Thus, gate bias control signal $E_G(t)$ of a class A FET amplifier will also be equal to a constant, $$E_G{}^A = -V_P + V_i = -V_P/2. \quad (14)$$

Thus, for a full drive single carrier input signal, a class $\bar{A}$ FET amplifier will function exactly like a class A amplifier, that is, each mode of operation will comprise the same power-added efficiency $\eta_{added}$ as a function of power gain G. The plot of this characteristic is illustrated by a broken line in FIG. 3.

When the input signal $v_i(t)$ is a multicarrier signal, the power-added efficiency of the class-A mode of operation drops off significantly, as seen by reference to the solid line plot in FIG. 3. For example, a class-A amplifier that exhibits a power gain of approximately 6.7 dB will have a power-added efficiency $\eta_{added}$ of approximately 40% when amplifying a single carrier input signal at full drive, as denoted by point 1 in FIG. 3. When a multiple carrier input signal is employed with an output backoff of 4 dB, however, the class-A power-added efficiency drops to approximately 15% for the same 6.7 dB power gain, as denoted by point 2 in FIG. 3. However, by employing a class-$\bar{A}$ FET amplifier formed in accordance with the present invention, the power-added efficiency for a 6.7 dB power gain rises to approximately 27%, as shown by point 3 in FIG. 3. Therefore, a class-$\bar{A}$ FET amplifier formed in accordance with the present invention, while having the same gain as a conventional class-A FET amplifier, yields a power-added efficiency that is more than 50 percent larger than that of class-A, independently of the gain.

What is claimed is:

1. A field-effect-transistor (FET) amplifier circuit responsive to a time-varying input signal ($v_i(t)$) for operating in a linear, class A mode and producing as an output an amplified time-varying output signal ($v_o(t)$), wherein said FET amplifier circuit comprises
    an FET amplifier (14) including a source input terminal, a drain input terminal, a gate input terminal, and an output terminal for receiving an input signal at said source input terminal and producing an amplified version thereof at said output terminal;
    a drain bias voltage source (18) for producing as an output a drain bias voltage signal ($E_D$) which is coupled to said drain input terminal of said FET amplifier;
    a capacitor (20) disposed between the output of said drain bias voltage source and a ground plane for removing time variations in a current from said drain bias voltage source;
    envelope detecting means (12) responsive to said time-varying input signal for producing as an output an envelope signal ($V_i(t)$) related to said time-varying input signal; and
    a gate bias voltage source (16) responsive to both a predetermined constant gate voltage ($E_{Go}$) and said envelope signal produced by said envelope detecting means for producing as an output a gate control signal ($E_G(t)$) equal to the sum thereof, said gate control signal subsequently coupled to said gate input terminal of said FET amplifier.

2. An FET amplifier circuit formed in accordance with claim 1 wherein said FET amplifier circuit further comprises
    a directional coupler (10) responsive to the time-varying input signal for producing a first large magnitude output signal and a second small magnitude output signal, where the sum of said first and said second output signals is equal to the magnitude of said time-varying input signal, said first large magnitude output signal coupled to the source input terminal of said FET amplifier and said second small magnitude output signal applied as the input to the envelope detecting means.

3. An FET amplifier circuit formed in accordance with claim 2 wherein the second small magnitude output signal of the directional coupler is of a value between approximately 10 dB and approximately 20 dB less than the time-varying input signal level.

4. An FET amplifier circuit formed in accordance with claim 1 wherein the predetermined constant gate voltage is equal to a negative value of a predetermined pinch-off voltage ($V_P$) of said FET amplifier and the drain bias voltage is equal to one-half of a predetermined maximum allowable drain voltage ($V_m$).

* * * * *